United States Patent [19]

Luebbe et al.

[11] Patent Number: 4,875,778
[45] Date of Patent: Oct. 24, 1989

[54] LEAD INSPECTION SYSTEM FOR SURFACE-MOUNTED CIRCUIT PACKAGES

[76] Inventors: Richard J. Luebbe, 6179 Paso Los Cerritos, San Jose, Calif. 95120; H. Kenneth Hopkins, 114 Rollingwood Dr., Boulder Creek, Calif. 95006

[21] Appl. No.: 185,838

[22] Filed: Apr. 25, 1988

Related U.S. Application Data

[63] Continuation-in-part of Ser. No. 153,764, Feb. 8, 1987.

[51] Int. Cl.$^4$ ............................................. G01B 11/00
[52] U.S. Cl. ..................................... 356/394; 356/237; 356/372
[58] Field of Search ............... 356/237, 372, 375, 387, 356/394; 388/101, 106, 107; 250/561, 562

[56] References Cited

U.S. PATENT DOCUMENTS

| | | | |
|---|---|---|---|
| 3,781,467 | 12/1973 | Soames | 178/6.8 |
| 4,520,702 | 6/1985 | Davis et al. | 83/71 |
| 4,549,087 | 10/1985 | Duncan et al. | 250/561 |
| 4,688,939 | 8/1987 | Ray | 356/237 |
| 4,696,047 | 9/1987 | Christian et al. | 382/8 |
| 4,728,195 | 3/1988 | Silver | 356/394 |

FOREIGN PATENT DOCUMENTS

| | | | |
|---|---|---|---|
| 91543 | 5/1986 | Japan | 356/237 |
| 233304 | 10/1986 | Japan | 356/237 |
| 36510 | 2/1987 | Japan | 356/237 |

OTHER PUBLICATIONS

Brochure "Surface Mount Lead Inspection System", Texas Instruments.

Primary Examiner—F. L. Evans
Attorney, Agent, or Firm—Burns, Doane, Swecker & Mathis

[57] ABSTRACT

An electro-optical system for detecting selected geometrical properties of leads of circuit packages of the surface-mounted type. The system employs a horizontally-arranged linear array of photosensitive elements which is moved in a direction perpendicular to a reference surface and operated to provide a series of one-dimensional horizontal scans along the leads.

24 Claims, 1 Drawing Sheet

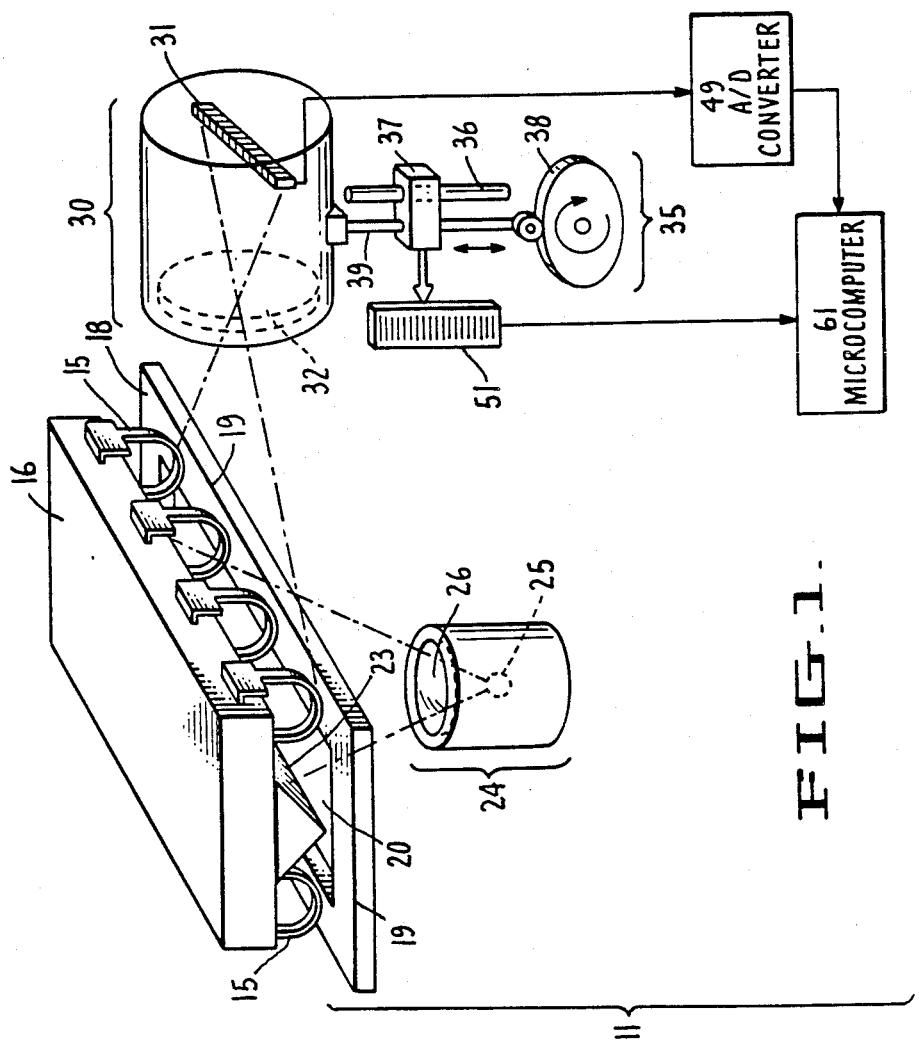

LEAD INSPECTION SYSTEM FOR SURFACE-MOUNTED CIRCUIT PACKAGES

RELATED APPLICATIONS

This application is a continuation-in-part if U.S. patent application Ser. No. 153,764, filed Feb. 8, 1987.

BACKGROUND OF THE INVENTION

1. Field of the Invention

The present invention generally relates inspection systems for inspecting leads on circuit packages and, more particularly, to inspection systems that inspect the leads on circuit packages of the surface-mounted type.

2. State of the Art

Circuit packages of the surface-mounted type are designed, as their name implies, for electrical connection to the surface of a circuit board. Typically, leads on surface-mounted circuit packages are finer and more closely spaced than leads on circuit packages of the dual in-line pin (DIP) type. For mounting surface-mounted packages to a circuit board, solder paste is silk-screened onto minute solder pads that are precisely located on the board to match the pattern, or "footprint", of properly aligned leads extending from the circuit package. After the desired number of circuit packages are placed on a board with the package leads embedded in the solder paste on the pads, the packages are permanently soldered into place. To achieve satisfactory electrical connections using surface-mounted packages, not only must the lead patterns of the packages match the patterns of pads on a circuit board but, also, all of the leads of the circuit package must make contact with the intended solder pads. This latter condition is often expressed by saying the leads of surface-mounted packages must be substantially coplanar. Typically, surface-packages are required to have the "contact ends" of their leads coplanar within less than about two to about four thousandths of an inch (mils).

As used above, the term "contact end" refers to the portion of a package lead which is intended to contact a solder pad when the package is placed in its normal position on a circuit board. Equivalently, the term "contact end" can be understood to refer to the portion of a circuit package lead which is closest to a flat reference surface when the circuit package rests in its normal position on the reference surface. It should be noted that the actual end of a lead of a surface-mounted package can be significantly different from the contact end, since surface-mounted circuit packages can have leads of various shapes including "J" and gull-wing like shapes. It should also be noted that, when a circuit package is viewed from its side, the contact end of a lead appears to have an edge; such an edge can be referred to as an "apparent edge".

Currently, several methods are used for detecting whether the contact ends of leads on surface-mounted circuit packages are coplanar. The conventional detection methods include reflected image comparisons, image analysis employing video cameras, transmitted light measurements, laser-based dimensional measurements, and cast-shadow analysis. Each of these inspection methods is discussed in copending U.S. patent application Ser. No. 153,764, filed Feb. 8, 1987, the disclosure of which is herein incorporated by reference. As set forth in the application, each of the known inspection methods has substantial drawbacks.

In particular it should be mentioned that workers in the art have used matrix-type video cameras in systems that inspect the leads of circuit packages. In this context, the term matrix-type video camera refers to video cameras that depict scenes in two dimensions. The use of matrix-type video cameras in systems for inspecting rows of pins on integrated circuit packages of the dual in-pin (DIP) type is described, for example, in U.S. Pat. No. 4,696,047. In the patented inspection system, a conveyor moves DIP packages past a matrix-type video camera which provides two-dimensional images of the pins. The images are analyzed by a signal processor which compares the images with references stored in the memory of a digital computer. Based upon the image comparisons, the inspection system rejects circuit packages whose pins do not meet specified tolerances.

Also, U.S. Pat. No. 4,668,939 discloses an automated system using a matrix-type video camera for inspecting solder bumps on chip carriers. According to the patent, the images provided by the matrix-type video camera are processed to provide one-dimensional intensity plots. The patent states that the intensity plots can be analyzed to detect missing, bridged or excessive solder bumps.

Image analysis employing matrix-type video cameras has several disadvantages. One difficulty arises from the fact that the two-dimensional video information is normally arranged in rectangular rasters having aspect ratios of about 4:3. By way of contrast, the region of interest when inspecting leads of circuit packages of the surface-mounted type can be, for example, about two-thousand wide by twenty mils, which equates to an aspect ratio of about 100:1. (In this example, the two-thousand mil dimension would represent the length of a surface-mounted package and the twenty mil dimension would encompass a space between the contact end of a lead and a reference surface.)

To increase aspect ratios when inspecting leads on circuit packages of the surface-mounted type with matrix-type video cameras, it is known to fit the cameras with cylindrical lenses that provide image magnification in the vertical direction greater than in the horizontal direction. That is, such lenses increase resolution in the vertical direction while retaining sufficient horizontal field width to allow viewing of an entire side of a circuit package. Even with such cylindrical lenses, however, matrix-type video cameras may not provide adequate resolution in both the vertical and horizontal dimensions for inspection of leads of circuit packages of the surface-mounted type.

At this juncture, it can be mentioned that linescan camera comprising linear arrays of photosensitive elements are also known. For example, a linescan camera comprised of photodiodes is disclosed, in U.S. Pat. No. 3,781,467. According to this patent, the linescan camera operates with a microscope to measure the length of non-metallic inclusions in polished steel specimens. Also, a linescan camera is disclosed in U.S. Pat. No. 4,520,702 which is directed to an apparatus for inspecting and cutting articles.

In a somewhat different technique for inspecting leads on surface-mounted circuit packages, fiber-optic sensors have ben used to make so-called "transmitted light" measurements. According to this technique, when a circuit package is placed on its leads on a planar surface, any gap between the contact end of a lead and the planar surface can be considered to be analogous to a gate. The quantity of light transmitted through a given "gate" is directly proportional to the gap between the contact end of an inspected lead and the reference surface. By measuring the light intensity at the gate locations, one can determine the extend to which the contact ends of leads of a circuit package are coplanar.

The technique of transmitted light measurements also has several disadvantages when inspecting circuit packages of the surface-mounted type. One drawback is that a complete sensor head must be custom designed and fabricated for each package configuration. Another disadvantage is that conversion of such systems from one package type to another is difficult and time-consuming. Still another drawback is that the transmitted light measurements can vary depending upon whether the apparent edges at the contact ends of the leads are horizontal or angled from horizontal.

In view of the preceding, it can be understood that a need exists for improvements in systems and methods for inspecting leads on circuit packages of the surface-mounted type to determine the extent to which the contact ends of leads are coplanar. Also, a need exists to provide systems and methods for measuring geometrical properties of leads on surface-mounted circuit packages such as the width of leads, distances center-to-center between leads, and spacings edge-to-edge between leads.

As will be evident in view of the following description, one advantage of the present invention is that leads on circuit packages of the surface-mounted type can be rapidly inspected with very high resolution. Another advantage of the present invention is that circuit packages of the surface-mounted type having a variety of sizes, shapes and lead types can be inspected without substantial modifications to the measurement system and without substantial changes in measurement accuracy. These and other advantages of the present invention can be ascertained by reference to the following description and attached drawing which illustrate the preferred embodiment.

BRIEF DESCRIPTION OF THE DRAWING

In the drawing:

FIG. 1 is a diagram which schematically shows, in perspective, an inspection system according to the present invention.

DETAILED DESCRIPTION OF THE PREFERRED EMBODIMENT

In FIG. 1, an electro-optical system, generally designated by the number 11, is provided to detect geometrical properties of the leads 15 of a circuit package 16 of the surface-mounted type. Included in system 11 is a reference surface 18 which is horizontally flat to support the contact ends of leads 15. It should be noted that reference surface 18 has sharp side edges 19 which lie in the plane of the surface. In the preferred embodiment, reference surface 18 is selectively rotatable in the horizontal plane in steps of ninety degrees. Mechanisms for providing such step-wise rotation are conventional and, for that reason, are not shown.

In the illustrated embodiment, reference surface 18 has a central rectangular aperture 20 whose size and shape depends upon the dimensions of the circuit package 16 under inspection. Preferably, aperture 20 should be as large as possible while still permitting reference surface 18 to have substantial area to support the contact ends of leads 15. The purpose of aperture 20 is to allow light to pass upwardly toward the bottom of circuit package 16.

As further shown in FIG. 1, a reflector member 23 is mounted above aperture 20 and an illumination source, generally designated by a number 24, is provided below the aperture. The purpose of illumination source 24 is to direct light upward through aperture 20 onto reflector member 23. In practice, the lateral sides of reflector member 23 are angled sufficiently to reflect light from source 24 against the back surfaces of leads 15. As a result, leads 15 are silhouetted when circuit package 16 is viewed from the side. The illumination source 24 can include, for example, a conventional high-intensity lamp 25 with a focusing lens 26.

Further in system 11, a linescan camera, generally designated by the number 30, is mounted adjacent reference surface 18. In linescan camera 30, a linear array 31 of photosensitive elements is fixedly arranged horizontally to extend parallel to reference surface 18. (In this context, the term "linear" refers to the fact that photosensitive elements are arranged in a generally straight line to form the array.) In practice, linescan camera 30 also includes a lens 32 which is interposed between array 31 and circuit package 16 to focus the individual leads 15 and reference edge 19 onto array 31.

A mechanism, generally indicated by the bracket 35, is provided to selectively move linescan camera 30 upward and downward perpendicular to reference surface 18. In the illustrated embodiment, mechanism 35 includes a guide member 36 which extends perpendicular to reference surface 18, a slider 37 mounted to slidably travel on guide member 36, a driven cam 38, and linkage 39 which is fixed to linescan camera 30 and which connects between cam 38 and slider 37.

In practice, linear array 31 is comprised of photoelectric transducers such as photodiodes or other photosensitive elements. Preferably, there are at least several hundred photosensitive elements in array 31. Such linear photosensitive arrays are commercially available from, for example, the Reticon Corporation of Sunnyvale, Calif.

As further shown in FIG. 1, output signals from linear array 31 are carried to an analog-to-digital converter 49. Such converters are conventional and, as such, operate to convert analog signals to digital signals.

Further in system 11, a linear position encoder 51 is mounted to detect the position of array 31 relative to reference edge 19. Such position encoders, sometimes known as linear motion potentiometers, are well known. From linear position encoder 51, electrical output signals are carried to a microcomputer 61. Microcomputer 61 also receives digital signals from analog-to-digital converter 49. As will be explained in the following, microcomputer 61 employs signals from linear array 31 and encoder 51 to measure and detect geometrical properties of leads 15.

To measure geometrical properties of the leads 15 of circuit package 16, the first step in operation of system 11 is to position circuit package 16 on the contact ends of its leads 15 on reference surface 18. Normally, not all of the leads 15 will touch reference surface 18 and, in fact, package 16 can be supported on the contact ends of only about three leads. With circuit package 16 properly positioned, illumination source 24 projects light onto reflector member 23 which, in turn, reflects light toward the back surfaces of leads 15. (In this context, the terms "front" and "back38 indicate the surfaces of leads 15 relative to photosensitive array 31.) With such illumination, leads 15 are silhouetted, the adjacent reference edge 19 appears dark, and any space between the adjacent reference edge 19 and the contact ends of leads 15 appears light.

Further in operation of the system, cam 38 is rotated to drive slider 37 up and down perpendicular to reference edge 19. That is, when cam 38 is rotated, slider 37 is forced to reciprocate on guide member 36, thereby causing array 31 to move up and down. It should be noted that, at all times during its movement, the photosensitive elements in array 31 extend in a line which is parallel to perpendicular edge 19. During its travel, array 31 is operated to scan the intensity of light over horizontal lines across the inspected leads 15. The vertical travel distance includes at least the normal space between the contact ends of leads 15 and edge 19 of reference surface 18, typically a distance of about twenty mils (i.e., twenty thousandths of an inch.) However, the travel distance of linear array 31 could include the entire distance from reference surface 18 to the bottom surface of circuit package 16. Normally, the scanned distance includes the entire length of the circuit package. Also, as array 31 travels vertically relative to reference edge 19, the position of the array is detected by linear encoder 51 and the position information is transmitted to microcomputer 61.

At this point, it should also be understood that various mechanisms can be used for moving linescan camera 30 vertically. Thus, mechanism 35 is just one example of such mechanisms. Another alternative is to mount linescan camera 30 to a hinge which adjustably tilts the camera in a precise arc over the vertical distance to be inspected. In this alternative, a detector would be provided to detect the tilt angle of the linescan camera. In this alternative embodiment, as in the one described earlier, the direction of travel of the linescan camera is perpendicular to reference surface 18.

In operation of linear array 31, light which is incident upon the photosensitive elements in the array is converted to voltage signals. Thus, output signals from the photosensitive elements in array 31 represent a series of light intensity values in analog form for each element in the array. The analog output signals are sent to analog-to-digital converter 49, which converts the signals to a digital form. Then, the digital signals are provided to microcomputer 61.

Generally speaking, microcomputer 61 analyzes the digital signal information to identify changes in the light intensity values along linear array 31. More particularly, microcomputer 61 detects the number of photosensitive elements which are relatively brightly illuminated in any one scan of the leads 15. In practice, microcomputer 61 also controls the number of scans per a given time or distance as linescan camera 30 travels vertically. In practice, as many as two hundred scans may be made during the time that linescan camera 30 travels twenty miles vertically. From such information, microcomputer 61 computes, for example, the extent to which the contact ends of leads 15 are coplanar within preselected limits relative to reference surface 18.

Normally in operation of system 11, after inspection of the leads on one side of circuit package 16, reference surface 18 is rotated ninety degrees horizontally and the inspection process is repeated for any leads on the end of package 16. When all leads on all sides of the circuit package have been inspected, calculations can be made by microcomputer 31 to determine the distance that any given lead deviates from the plane of reference surface 18 and, thus, to determine the extent to which the contact ends of leads 15 are coplanar. In addition, system 11 can detect geometrical properties such as the width of each lead, the center-to-center distances between leads, and the edge-to-edge spacings between leads. System 11 can also be used to detect the minimum distance, or "stand-off", between the bottom of circuit package 16 and reference surface 18.

At this juncture, it can be appreciated that system 11 permits optical resolution to be modified independently in the vertical and horizontal directions. In the vertical dimension, optical resolution is determined by the frequency of horizontal scans as linear array 31 travels vertically and by the rate of vertical travel. Thus, vertical resolution can be increased by increasing the number of scans over a given vertical distance or by decreasing the rate of vertical travel. In either case, vertical resolution is adjusted without affecting resolution in the horizontal dimension.

In the horizontal dimension, resolution is determined by the number of photosensitive elements comprising linear array 31 and by the focusing optics (i.e., lens 32). Changes in horizontal resolution can be made by increasing or decreasing the operative number of photosensitive elements in linear array 31 or by changing the focusing optics (i.e., lens 32) to provide a wider, or narrower, viewing angle. Again, it should be noted that changes in vertical resolution can be made without affecting horizontal resolution.

Although the present invention has been described in its preferred embodiment, those skilled in the art will appreciate that variations may be made without departing from the spirit and scope of the invention as defined in the appended claims and equivalents. For example, although the foregoing description has emphasized vertical movement of linear array 31 relative to a stationary reference surface 18, array 31 could be held stationary and the reference surface could be raised or lowered, thereby carrying a circuit package past the linear array for inspection. As another example, it can be understood that inspection system 11 can include more than one array such as linear array 31; for instance, four such linear arrays can be provided with each array positioned to face a different side of circuit package 16.

Still further, it should be appreciated that leads 15 could be illuminated by front lighting rather than being silhouetted by back lighting. In other words, the critical criteria is that illumination must be provided to produce sharp optical contrast at the sides and contact ends of leads 15. According to this alternative, reflector member 23 can be eliminated.

In yet another alternative, the positions of linescan camera 30 and illumination source 24 can be interchanged. That is, source 24 can be mounted to illuminate the front sides of leads 15 and linescan camera 30 can be positioned to view images of silhouettes of the leads reflected from reflector member 23.

What is claimed is:

1. A process for inspecting leads on circuit packages of the surface-mounted type, comprising the steps of:
   positioning a circuit package for inspection on a generally horizontal reference surface having at least one horizontal reference edge;
   illuminating the package to produce sharp optical contrast at the edges and contact ends of the leads;
   moving a horizontally-arranged linear array of photosensitive elements in a direction substantially perpendicular to the reference edge;

operating the horizontally-arranged linear array of photosensitive elements to provide a series of one-dimensional scans horizontally across the leads; and analyzing signal information obtained from the horizontal scans to detect and measure selected geometrical properties of the inspected leads.

2. A process according to claim 1 wherein the signal information is analyzed to measure the vertical distance between the reference edge and the contact end of each lead.

3. A process according to claim 2 wherein all leads on all sides of the circuit package are scanned, and the signal information from the scans is analyzed to measure the extent to which the contact ends of the leads of the circuit package are coplanar within preselected limits.

4. A process according to claim 1 wherein silhouettes of the package leads are produced by casting light onto the backs of the leads.

5. A process according to claim 1 including the step of focusing silhouetted images of the contact ends of leads onto the array.

6. A process according to claim 1 including the steps of detecting vertical travel of the horizontal array relative to the reference edge, providing position-identifying signals that represent the location of the vertically moving array, and employing the position-identifying signal information to provide selected measures of the geometry of the contact ends of the leads.

7. A process according to claim 1 wherein the position-identifying signal information is analyzed to measure the extent to which the contact ends of leads deviate from the plane of the reference surface.

8. A process according to claim 1 wherein the signal information is analyzed to measure center-to-center distances between leads.

9. A process according to claim 1 wherein the signal information is analyzed to measure edge-to-edge spacings between leads.

10. A process according to claim 1 wherein the signal information is analyzed to measure standoff of the circuit package relative to the reference surface.

11. A process for inspecting leads on circuit packages of the surface-mounted type comprising the steps of:
positioning a circuit package for inspection on a generally horizontal reference surface having a horizontal edge;
moving a horizontally-arranged linear array of photosensitive elements in a direction which is perpendicular to the reference surface;
operating the photosensitive elements of the linear array to provide a series of one-dimensional scans along the leads in the horizontal direction;
analyzing signal information provided by the scans to measure selected geometrical properties of the inspected leads.

12. A process according to claim 11 including the steps of detecting vertical movement of the array relative to the reference surface, providing position-identifying signals that represent the location of the array, and employing the position-identifying signal information to measure geometrical properties of the contact ends of the leads.

13. A process according to claim 11 wherein silhouettes of the package leads are produced by casting light onto the backs of the leads and the photosensitive elements are operated to detect outlines provided by the silhouettes.

14. A process according to claim 12 wherein the position-identifying signal information is analyzed to measure the vertical distance between the reference edge and the contact end of each lead.

15. A process according to claim 14 wherein the signal information is analyzed to determine the spacing between leads.

16. A process for inspecting leads on circuit packages of the surface-mounted type, comprising the steps of:
positioning a circuit package for inspection on a generally horizontal reference surface having a horizontal reference edge;
providing illumination to silhouette the package leads;
moving a horizontally-extending linear array of photosensitive elements in a direction perpendicular to the reference surface, and detecting the position of the moving array relative to the reference edge;
operating the array of photosensitive elements to provide a series of horizontally scans; and
analyzing the signal information obtained from the horizontal scans to measure geometrical properties of the inspected leads.

17. A system for inspecting leads on circuit packages of the surface-mounted type comprising:
support means for providing a horizontal reference surface for supporting a circuit package for inspection;
illumination means for silhouetting the package leads;
a linear array of photosensitive elements mounted to extend horizontally and operative to provide one-dimensional scans of the leads of the package under inspection;
means for moving the linear array vertically relative to the support means; and
means for analyzing signal information provided by the photosensitive elements of the linear array during a series of scans to provide information as to geometrical properties of the inspected leads.

18. A system according to claim 17 wherein the information obtained from scans made by the linear array is used to measure the vertical distances between the reference surface and the contact ends of the inspected leads.

19. A system according to claim 17 further including location-detecting means for detecting the location of the array relative to the reference surface.

20. A system according to claim 19 wherein the means for analyzing signal information employs signals from the location-detecting means and from the photosensitive elements to measure the distance between the contact ends of inspected leads and the reference surface.

21. A system for inspecting leads on circuit packages of the surface-mounted type comprising:
support means for providing a reference surface for supporting a circuit package for inspection;
a linear array of photosensitive elements mounted to extend horizontally to scan the leads of the circuit package;
means for moving the linear array in a direction perpendicular to the reference surface; and
means for analyzing signal information provided by the linear array to detect selected geometrical properties of the leads.

22. A system according to claim 21 further including illumination means to silhouette the contact ends of the package leads.

23. A system according to claim 22 wherein the illumination means includes a reflector mounted to the support means to reflect light onto the back surfaces of the package leads.

24. A system according to claim 23 wherein the support means has an aperture formed therein to received light which is to be reflected by the reflected means.

* * * * *